United States Patent
Edelman et al.

(10) Patent No.: US 8,154,287 B2
(45) Date of Patent: Apr. 10, 2012

(54) SYSTEM AND METHOD FOR GHOST MAGNETIC RESONANCE IMAGING

(75) Inventors: Robert R. Edelman, Highland Park, IL (US); Ioannis Koktzoglou, Rolling Meadows, IL (US)

(73) Assignee: NorthShore University HealthSystem, Evanston, IL (US)

( * ) Notice: Subject to any disclaimer, the term of this patent is extended or adjusted under 35 U.S.C. 154(b) by 445 days.

(21) Appl. No.: 12/509,180

(22) Filed: Jul. 24, 2009

(65) Prior Publication Data

US 2010/0134103 A1    Jun. 3, 2010

Related U.S. Application Data

(60) Provisional application No. 61/083,627, filed on Jul. 25, 2008, provisional application No. 61/102,197, filed on Oct. 2, 2008.

(51) Int. Cl.
*G01V 3/00* (2006.01)
(52) U.S. Cl. ......................... 324/309; 324/306
(58) Field of Classification Search .................. 324/309, 324/306, 312
See application file for complete search history.

(56) References Cited

U.S. PATENT DOCUMENTS

| | | | | |
|---|---|---|---|---|
| 4,618,827 A | * | 10/1986 | Redington et al. | 324/309 |
| 5,363,044 A | * | 11/1994 | Xiang et al. | 324/309 |
| 7,734,078 B2 | * | 6/2010 | Prince et al. | 382/130 |

* cited by examiner

*Primary Examiner* — Louis Arana
(74) *Attorney, Agent, or Firm* — Quarles & Brady LLP

(57) ABSTRACT

A system and method enables the creation of medical images using data related to ghost artifacts. The method thus allows components of an imaged subject to be segmented based on state changes in the components that lead to the controlled production of ghost artifacts. This is achieved in MR by performed a pulse sequence so that multiple sets of MR data are acquired in which the signals from a target tissue vary across the data sets while the signals from a background tissue do not vary across the data sets. A composite data set is generated by populating selected k-space lines of the composite data set with information from a first MR data set and populating the remaining k-space lines of the composite data set with information from a second MR data set. An MR image is then reconstructed from the composite data set. The MR image contains ghost artifacts that faithfully reproduce the 2D or 3D anatomic detail of the target tissues without signal contributions from the background tissues, allowing for background-suppressed or segmented MR images of a target tissue without the need for image subtraction.

30 Claims, 3 Drawing Sheets

SYSTEM AND METHOD FOR GHOST MAGNETIC RESONANCE IMAGING

CROSS-REFERENCE TO RELATED APPLICATIONS

This application claims the benefit of U.S. Provisional patent application Ser. No. 61/083,627, filed on Jul. 25, 2008, and U.S. Provisional patent application Ser. No. 61/102,197, filed on Oct. 6, 2008, both entitled "SYSTEM AND METHOD FOR GHOST MAGNETIC RESONANCE IMAGING."

FIELD OF THE INVENTION

This invention relates generally to systems and methods for magnetic resonance imaging ("MRI") and, more particularly, to a system and method for utilizing ghost artifacts to reconstruct a medical image of a subject.

BACKGROUND OF THE INVENTION

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear" or a "Cartesian" scan. There are many other k-space sampling patterns used by MRI systems. These include "radial", or "projection reconstruction" scans in which k-space is sampled as a set of radial sampling trajectories extending from the center of k-space.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1 DFT of each radial projection view and then transforming the Radon space data set to image space by performing a filtered backprojection.

An important application of MRI is angiography. The current gold standard for evaluating the arterial system is digital subtraction angiography (DSA), which provides detailed images that can be used to determine the presence and extent of conditions such as arterial stenoses and occlusions. DSA has a high specificity and sensitivity, but despite advances in DSA and catheter technology, risks associated with angiography persist and include allergic reaction, reduced renal function, and complications related to the arteriotomy and intravascular catheter manipulation. Because of its invasiveness and risk, it is unsuitable as a routine screening test for vascular disease.

Magnetic resonance angiography (MRA) has great potential as a non-invasive alternative to catheter-based DSA, as it is safer and generally less costly. MRA uses the magnetic resonance phenomenon to produce images of the human vasculature. A paramagnetic contrast agent such as gadolinium can be injected into the patient prior to the MRA scan to enhance the diagnostic capability of MRA. By infusing a sufficient quantity of gadolinium contrast agent into the blood, the T1 relaxation time can be shortened to 100 ms or less, particularly during the first pass of contrast agent through the arteries. Under these conditions, a three-dimensional spoiled gradient-echo pulse sequence is used to acquire data, typically using a repetition time (TR) as short as 3-6 ms and echo time (TE) as short as 1-2 ms. If the number of phase-encoding lines are chosen appropriately, then the data can be acquired within a reasonably short period, for example, on the order of 15-30 s. The short acquisition is important because it ensures that most data is acquired during the peak arterial phase of contrast enhancement.

If the central lines of k-space are acquired prior to the arrival of contrast, severe image artifacts can limit the diagnostic information in the image. Arterial images acquired after the passage of the peak arterial contrast are sometimes obscured by the enhancement of veins. In many anatomic regions, such as the renal arteries or carotid, the separation between arterial and venous enhancement can be as short as 6 seconds. Thus, many MRA studies can be difficult to implement without including some degree of unwanted venous signal. The short separation time between arterial and venous enhancement also dictates the use of acquisition sequences having either a low spatial resolution or very short repetition times (TR). Short TR acquisition sequences severely limit the signal-to-noise ratio (SNR) of the acquired images relative to those exams in which longer TRs are possible. The rapid acquisitions required by first pass CEMRA methods thus impose an upper limit on either spatial or temporal resolution.

Contrast-enhanced MRA of the peripheral arteries has become a routinely used imaging study in recent years. It depicts arterial stenoses and occlusions and aids treatment planning of patients with known or suspected peripheral arterial occlusive disease. Currently, a widely used approach involves the intravenous infusion of a gadolinium contrast medium, combined with use of a stepping table and acquisition of manually-positioned coronal scan volumes at several table positions ("stations").

Although the paramagnetic contrast agents in clinical use have excellent safety profiles, the recent discovery of nephrogenic system fibrosis (NSF) as a potential side effect of gadolinium administration has dampened enthusiasm for contrast-enhanced MRA and led to a "black box" warning from the United States Food and Drug Administration. The risk of NSF relates to the presence of severely impaired renal function, as well as to the dose and stability of the contrast agent. Unfortunately, peripheral MRA studies typically entail the administration of high doses of contrast agent. Given the risk of NSF as well as the substantial cost for the high dose of contrast agent, a non-contrast alternative would be beneficial.

In addition to contrast-enhanced MRA, several contrast mechanisms have been used to create angiograms that are not dependent on contrast administration. These include time of flight (TOF), phase contrast (PC), subtraction of images acquired at different phases of the cardiac cycle (as originally reported and more recently using the fresh blood imaging technique), using inversion recovery and T2-preparation for background suppression, and contrast based on the bright blood signal produced by balanced steady-state free precession (bSSFP) pulse sequences. Each of these non-contrast-agent-based imaging techniques has drawbacks or is not suitable for particular imaging studies. For example, early work with TOF and PC techniques demonstrated that it was feasible to depict intra- and extracranial vascular lesions of the head and neck with an accuracy approaching that of conventional x-ray angiography. Phase contrast techniques also enable functional evaluation through the measurement of blood flow. However, time-of-flight and phase contrast methods are inadequate for major body MRA applications, such as imaging of the renal or peripheral arteries.

In addition, all of these imaging techniques are susceptible to motion artifacts. This is especially true for image subtraction techniques, where even motion at a sub-pixel level can cause subtraction artifacts that degrade diagnostic quality. For example, in contrast-enhanced breast MRI, subtraction artifacts routinely impede the detection of small enhancing tumors and can lead to false positive diagnoses. Throughout the history of clinical MR, an overriding goal has been to eliminate artifacts resulting from motion, which degrade the images and can render them uninterpretable. In the case of MRA, a particular focus has been on the suppression of periodic image artifacts, called "ghosts," which result from non-steady flow patterns in arteries.

It would therefore be desirable to have a system and method for performing background-suppressed 3D MRI without the need for image subtraction that provides a high signal-to-noise ratio (SNR), does not suffer from artifacts, and is versatile.

SUMMARY OF THE INVENTION

The present invention overcomes the aforementioned drawbacks by providing a system and method for MR imaging of a subject indirectly. Contrary to the widely held notions that ghosts are artifacts that interfere with imaging, the present invention, counter-intuitively, recognizes that ghost artifacts actually contain information that can be used to reconstruct and segment detailed background-suppressed MR images.

In accordance with one aspect of the invention, a method for producing an MR image of a subject is disclosed that includes acquiring a first MR data set from a region-of-interest (ROI) in a subject while a target tissue is in a first state and a background tissue is in a second state and acquiring a second MR data set from the ROI while the target tissue is in a third state and the background tissue is in the second state. The method also includes selectively combining the first and second MR data sets to produce a composite data set in which selected k-space lines are populated using MR data from the first MR data set and remaining k-space lines are populated using MR data from the second MR data set. The method further includes transforming the composite data set to produce an MR image having desired ghost artifacts that depict the target component and substantially exclude signal corresponding to the background tissue.

In accordance with another aspect of the invention, a method for producing a medical image of a target component in subject is disclosed that includes acquiring image data from an ROI in the subject including a target component and a background component using a medical imaging system and generating a composite data set configured to produce ghost artifacts from the acquired image data. The method also includes transforming the composite data set to produce a medical image having desired ghost artifacts substantially depicting the target component and substantially excluding signal from the background component.

In accordance with still another aspect of the invention, a method for producing an MR image of a subject is disclosed that includes acquiring a flow-sensitive MR data set from an ROI in a subject at periodic intervals without synchronization to the cardiac cycle and acquiring a flow-insensitive MR data set from the ROI in the subject at periodic intervals with synchronization to the cardiac cycle. The method further includes selectively combining the flow-sensitive and flow-insensitive MR data set to produce a composite data and transforming the composite data set to produce an MR image having desired ghost artifacts that depict the target component and substantially exclude signal corresponding to the background tissue.

Various other features of the present invention will be made apparent from the following detailed description and the drawings.

BRIEF DESCRIPTION OF THE DRAWINGS

The invention will hereafter be described with reference to the accompanying drawings, wherein like reference numerals denote like elements, and.

DETAILED DESCRIPTION OF THE INVENTION

Figure 1:
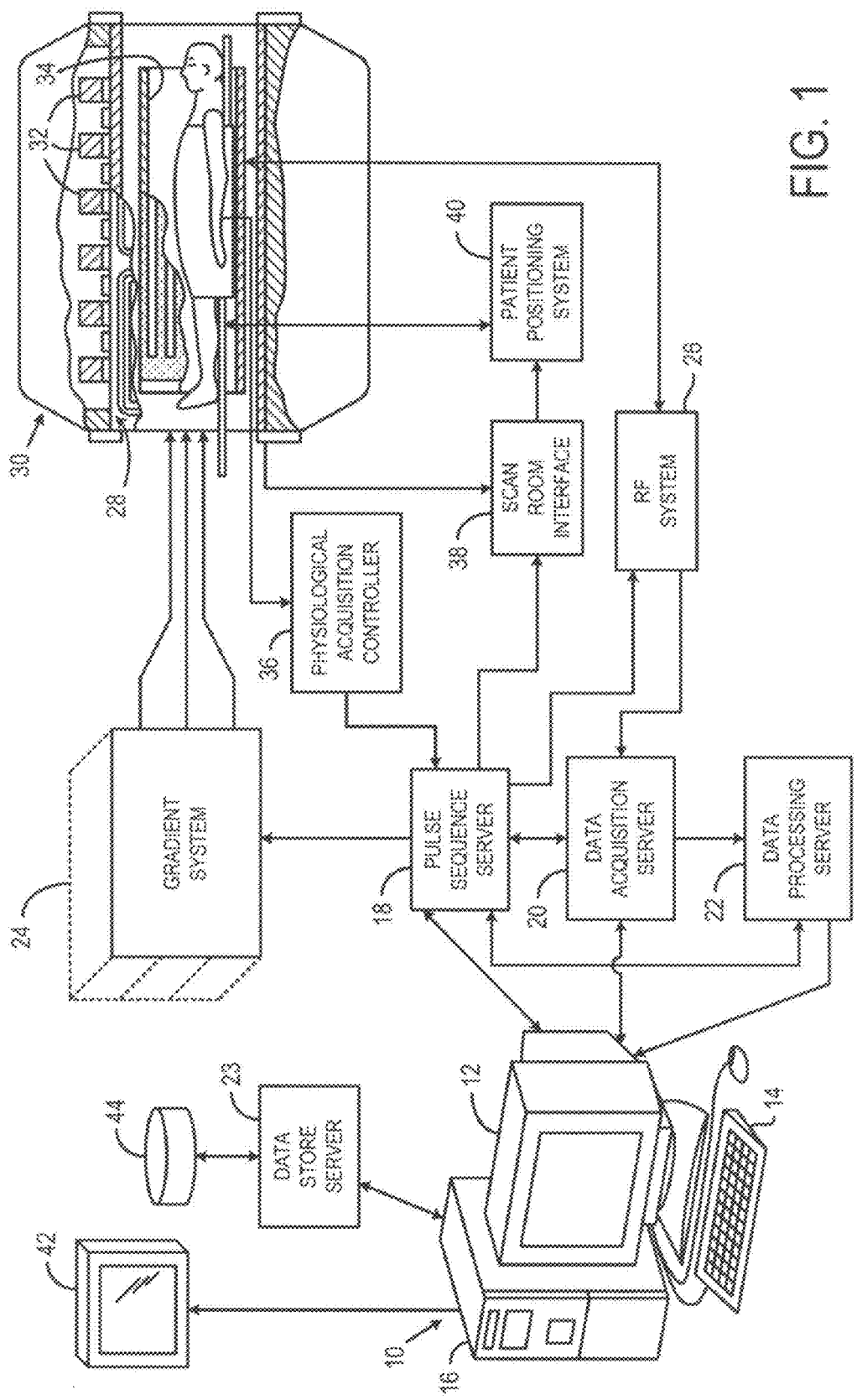
FIG. 1 is a block diagram of an MRI system that employs the present invention.

Referring to FIG. 1, the present invention is employed in an MRI system. The MRI system includes a workstation 10 having a display 12 and a keyboard 14. The workstation 10 includes a processor 16 that is a commercially available programmable machine running a commercially available operating system. The workstation 10 provides the operator interface that enables scan prescriptions to be entered into the MRI system. The workstation 10 is coupled to four servers including a pulse sequence server 18, a data acquisition server 20, a data processing server 22, and a data store server 23. The workstation 10 and each server 18, 20, 22 and 23 are connected to communicate with each other.

The pulse sequence server 18 functions in response to instructions downloaded from the workstation 10 to operate a gradient system 24 and an RF system 26. Gradient waveforms necessary to perform the prescribed scan are produced and applied to the gradient system 24 that excites gradient coils in an assembly 28 to produce the magnetic field gradients $G_x$, $G_y$, and $G_z$ used for position encoding MR signals. The gradient coil assembly 28 forms part of a magnet assembly 30 that includes a polarizing magnet 32 and a whole-body RF coil 34.

RF excitation waveforms are applied to the RF coil 34 by the RF system 26 to perform the prescribed magnetic resonance pulse sequence. Responsive MR signals detected by the RF coil 34 or a separate local coil (not shown in FIG. 1) are received by the RF system 26, amplified, demodulated, filtered, and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays (not shown in FIG. 1).

The RF system 26 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2},$$

and the phase of the received MR signal may also be determined:

$$\phi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 that receives signals from various sensors associated with the condition of the patient and the magnet system. It is also through the scan room interface circuit 38 that a patient positioning system 40 receives commands to move the patient to desired positions during the scan.

The digitized MR signal samples produced by the RF system 26 are received by the data acquisition server 20. The data acquisition server 20 operates in response to instructions downloaded from the workstation 10 to receive the real-time MR data and provide buffer storage such that no data is lost by data overrun. In some scans the data acquisition server 20 does little more than pass the acquired MR data to the data processor server 22. However, in scans that require information derived from acquired MR data to control the further performance of the scan, the data acquisition server 20 is programmed to produce such information and convey it to the pulse sequence server 18. For example, during prescans, MR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process MR signals used to detect the arrival of contrast agent in an MRA scan. In all these examples the data acquisition server 20 acquires MR data and processes it in real-time to produce information that is used to control the scan.

The data processing server 22 receives MR data from the data acquisition server 20 and processes it in accordance with instructions downloaded from the workstation 10. Such processing may include, for example, Fourier transformation of raw k-space MR data to produce two or three-dimensional images, the application of filters to a reconstructed image, the performance of a backprojection image reconstruction of acquired MR data; the calculation of functional MR images, the calculation of motion or flow images, and the like.

Images reconstructed by the data processing server 22 are conveyed back to the workstation 10 where they are stored. Real-time images are stored in a data base memory cache (not shown) from which they may be output to operator display 12 or a display 42 that is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

As appreciated by one of ordinary skill, the above-described system can be used to perform a number of imaging studies, including angiography studies and the like. In accordance with the present invention, the system may be programmed to perform at least one pulse sequence designed to produce ghost artifacts from one or more target tissues but not from background tissues. This ghost-based imaging technique allows for the creation of background-suppressed 2D or 3D MR images without the need for image subtraction. This represents a new contrast and segmentation mechanism for the creation of MR images based on ghost artifacts. In the peripheral vascular system, for example, the ghost-based imaging enables the creation of fully-resolved arteriograms depicting the lower extremities with almost no background signal contamination.

Figure 2:
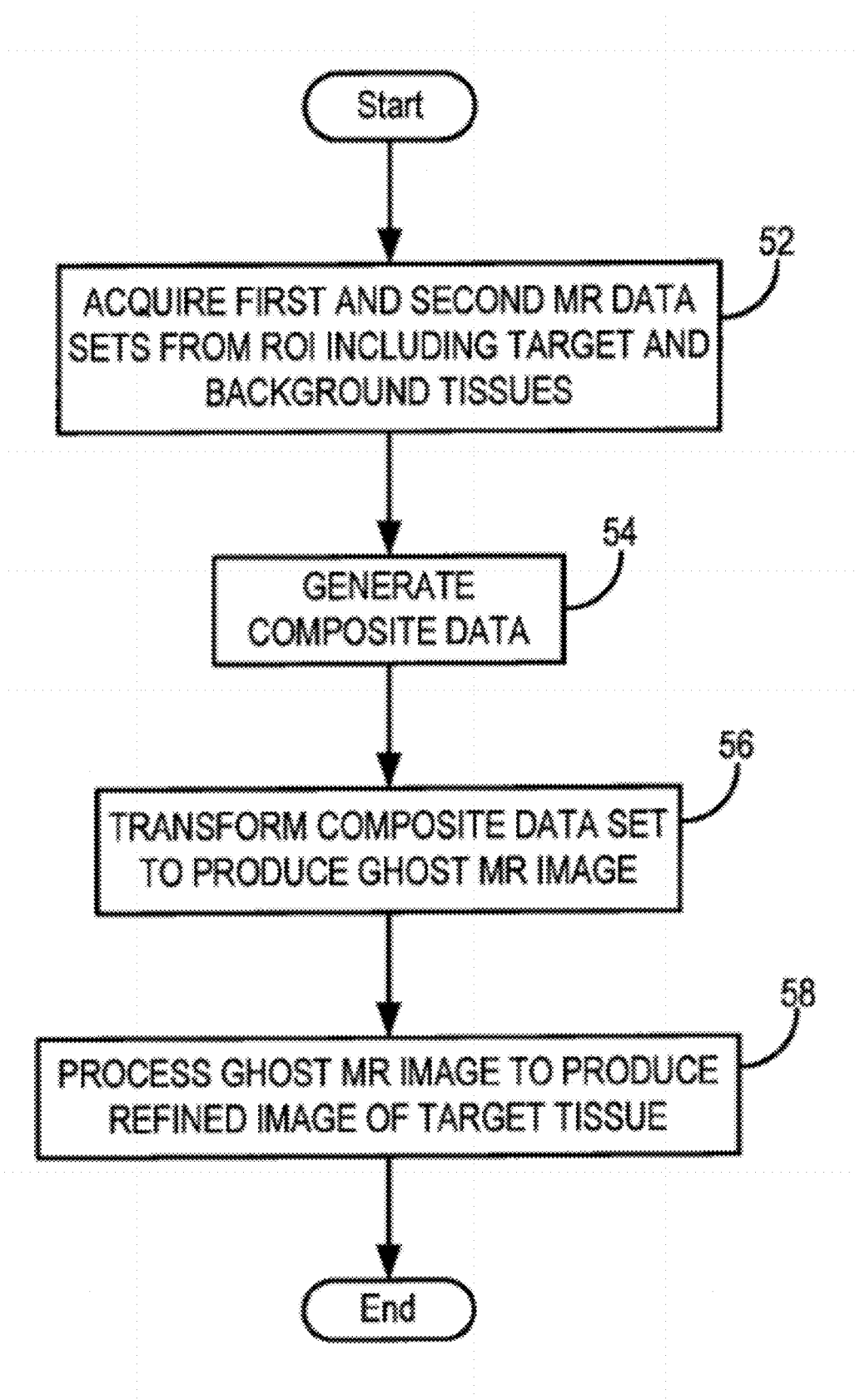
FIG. 2 is a flowchart setting forth the steps for performing ghost-based imaging tin accordance with the present invention using the MRI system of FIG. 1.

Referring now to FIG. 2, one embodiment for ghost-based imaging begins at process block 52 with the performance of at least one pulse sequence and the acquisition of two sets of MR data from a region-of-interest (ROI) in a subject. A variety of pulse sequences can be employed such that the signal intensities of background tissues are similar between the data sets, but the signals from target tissues differ. That is, a variety of image acquisitions can be used so long as changes in the state of the target tissue are captured by differences between the first and second data sets, while the background tissue maintains a relatively constant state. For example, a 3D spoiled, gradient-echo acquisition can be used to acquire the first set of k-space data prior to the administration of a gadopentetate dimeglumine contrast agent and the second set of k-space data during enhancement of the vasculature by the contrast agent. In this case, the state of the target tissue changes from contrast-unenhanced to contrast-enhanced.

In order to produce ghost artifacts from the target tissues, a composite data set is created at process block 54 by selectively combining the two MR data sets. In effect, this process spatially undersamples time-resolved scan data while maintaining the original sampling rate for temporally-constant scan data, thus providing the basis for the creation of ghost artifacts. This can be accomplished by taking one out of every n slice-encoding lines from the first data set and the remaining slice-encoding lines from the second data set. Using the above-discussed 3D spoiled gradient echo acquisition, for example, the even slice-encodes of the composite data set may be taken from the first data set acquired prior to contrast agent administration, while the odd slice-encodes may be taken from the second data set acquired during contrast agent enhancement.

Figure 3:
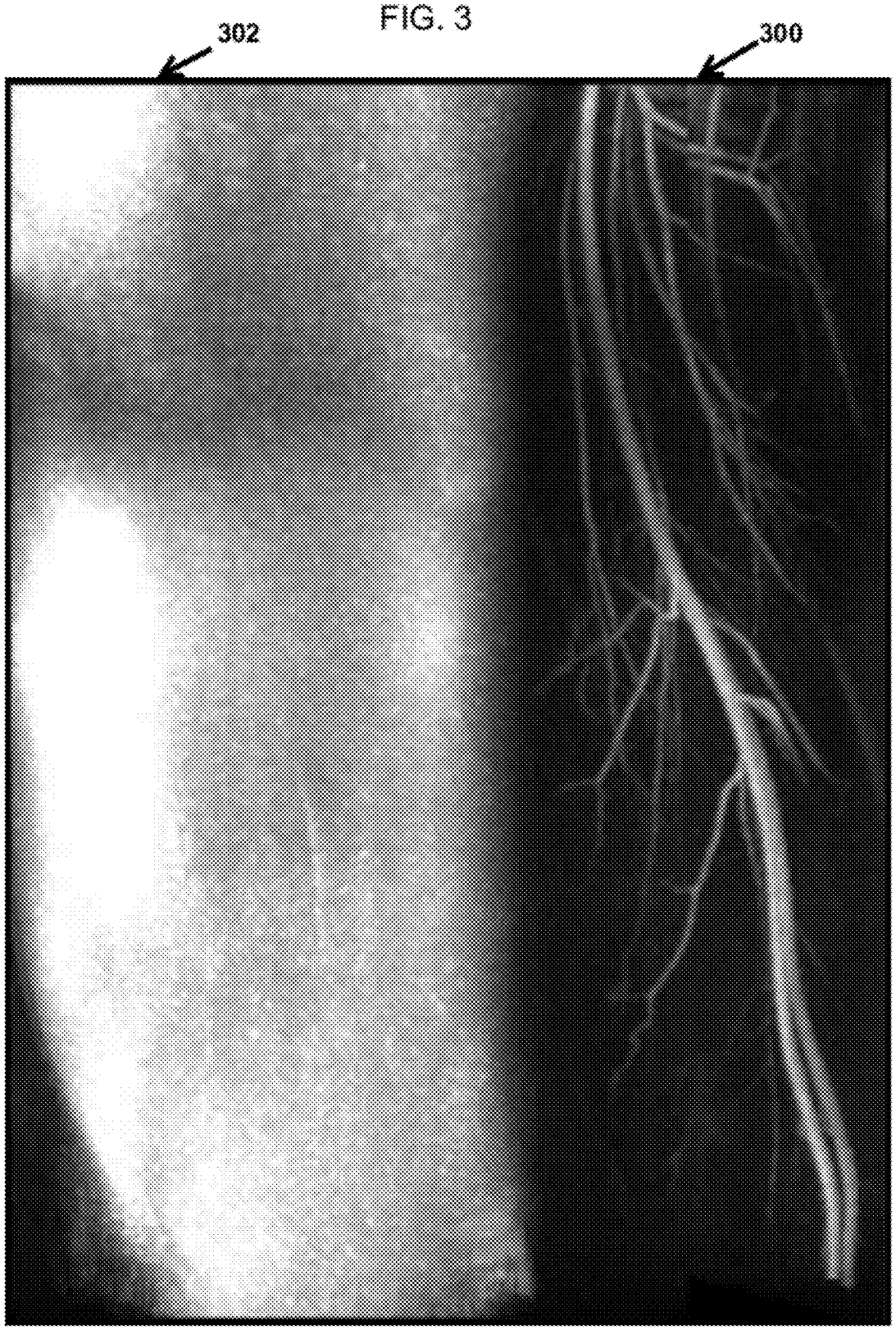
FIG. 3 is a representative illustration of an acquired image and ghost artifacts showing the stages for the generation of ghost-based image when applied to an angiogram of the popliteal trifurcations.

Referring to FIGS. 2 and 3, at process block 56, the composite data set is transformed to produce a "ghost image" in which the variation in signal intensity from target tissues and background tissues between the slice-encodes taken from the first and second data sets results in the production of ghost artifacts corresponding the target tissues. A Fourier transform can be used to achieve this effect and generate a ghost image in which the artifacts propagate along the slice-encoding direction out of the body and into the surrounding space. Since the composite data set produced at process block 54 includes data corresponding to the region outside that occupied by the background tissue, the slices containing the ghost artifacts faithfully reproduce the anatomic detail of the target tissues and are substantially free of signal corresponding to the background tissues. For example, the MR image of FIG. 3 shows signal 300 from targeted peripheral vasculature deposited at a "virtual location" outside the "imaged" region 302, which includes undesired signal from the background tissue. This effect can be considered as arising from sampled differences between temporally varying data from the target tissue and constant or static data from the background tissue. The sampled differences cause the temporally varying data to "shift" along a spatial axis to the virtual image region. The composite data produced at process block 54 can accommodate this shift by including entries corresponding to the virtual image region, for example, by including additional slice-encodes filled with zero values or with MR data acquired from the appropriate space outside the ROI.

At process block 58, a refined image of the target tissue can be generated from the ghost image. Since the ghost image includes signal corresponding to the target tissue deposited alongside signal corresponding to the background tissue, an image depicting only the target tissue can be produced by truncating the "ghost image" to exclude the region containing the background signal. Other processing steps can be performed to enhance the conspicuity of the ghost artifacts. Maximum intensity projection (MIP), summation, or clustering techniques can be performed to enhance the interpretability of the image. Additionally, mathematical filters that exploit the periodicity of the ghost artifacts can be used to enhance image quality and predict the nature of the original MR data sets.

The above-described method is not limited to situations where odd and even slice-encodes are interleaved to produce the composite data set. Other patterns of interleaving k-space lines are possible, so long as the signal intensities of background tissues and those of target tissues are different. The creation of the composite data set is also not limited to the selective combination of slice-encodes from two different data sets. It is noted that the technique is not limited to two data sets and may be extended to the combination of more than two data sets. For example, a time-series of MR images showing the passage of contrast agent through the vasculature may be produced. Ghost-based imaging can also be performed by selectively combining phase-encodes in a similar manner to produce ghost images in which the ghost artifacts propagate along the phase-encoding axis instead of the slice-encoding axis. In this manner the technique can be applied for a 2D acquisition as well as for a 3D acquisition. The signal strength and periodicity of ghost-artifacts in reconstructed images can be adjusted by varying the percentage of lines taken from the various data sets when producing the composite data set.

The present invention is also not limited to contrast-enhanced angiography applications. For example, background-suppressed MRA images can be produced without the use of contrast agent by populating the even k-space lines of the composite data set with MR data acquired during diastole using a 3D single shot turbo spin-echo acquisition and populating the odd k-space lines with MR data acquired during systole using the 3D single shot spin-echo acquisition. Arterial blood imaged during diastole appears brighter due to the low blood velocity, while arterial blood imaged during systole appears darker due to the increased blood velocity. Similarly, the composite data set can be populated with data acquired during two 3D balanced steady-state free precession acquisitions, an acquisition with pre-inversion so that arterial spins appear dark and an acquisition without pre-inversion so that arterial spins appear bright. In either of these imaging applications, a ghost MR angiogram substantially free of signal from the background tissue can be produced from the composite data set. Moreover, ghost artifacts can be generated by applying a flow-sensitive pulse sequence at periodic intervals without synchronizing the acquisition to the cardiac cycle. Lines of k-space randomly acquired during fast systolic flow have a different signal intensity from those randomly acquired during slow diastolic flow, thereby producing ghost artifacts which can be manipulated into an MRA image. Ghost-based imaging can also be used in conjunction with parallel imaging for accelerated data acquisition. In fact, because this method allows the segmentation of image components having a variable state from those having a constant state, it can be employed more generally to segment any target tissue whose state changes can be captured by a medical imaging system from background tissues whose state does not changes or whose state changes are not captured by the medical imaging system. For instance, a segmented MR image of fat in a subject could be produced in accordance with the present invention by selectively combining fat-suppressed MR data with non-fat-suppressed MR data Certain implementations of the current invention permit multiple views of the target tissue to be reconstructed, whereas others only provide a single view. For implementations that create a single view, projection images can be acquired in any desired orientation if additional projections are needed. Unlike most methods for 3D MR imaging, spatial resolution in ghost-based imaging is not predicated on scan time. In principle, just a few phase-encodes are needed to produce a fully-resolved image, though image SNR can decrease with reduced scan time. Moreover, if too few phase- or slice-encoding steps are acquired, then Fourier truncation artifacts, or "Gibbs" artifacts, can overlap the ghost artifacts and degrade diagnostic quality. It is nonetheless possible to rapidly acquire fully-resolved MRA image data without any apparent loss of detail from reduced repletion time (TR), reduced number of phase-encoding steps, or increased parallel acceleration factors.

Ghost-based imaging offers significantly improved image quality over traditional image subtraction-based techniques. For example, subtraction artifacts due to motion often plague subtraction-based images. Also, image diagnostic quality can be markedly degraded even by motion at a sub-pixel level. Rather than suppressing background tissue in image space, ghost-based imaging suppresses these signals in k-space and is, consequently, less susceptible to patient motion or image registration errors. In contrast-enhanced breast MRI, for example, the present invention can be used to image small enhancing tumors that would otherwise be obscured by subtraction artifacts. It can be seen as ironic that such artifact-free images are produced from ghost data that is traditionally considered an undesirable artifact to be eliminated by flow compensation, pre-saturation, or any other means possible.

The present invention has been described in terms of the various aspects and features, and it should be appreciated that many equivalents, alternatives, variations, and modifications, aside from those expressly stated, are possible and within the scope of the invention. Therefore, the invention should not be limited to a particular described embodiment.

The invention claimed is:

1. A method for producing an MR image of a subject comprising:
   a) acquiring a first MR data set from a region-of-interest (ROI) in a subject while a target tissue is in a first state and a background tissue is in a second state and acquiring a second MR data set from the ROI while the target tissue is in a third state and the background tissue is in the second state;
   b) selectively combining the first and second MR data set to produce a composite data set in which selected k-space lines are populated using MR data from the first MR data set and remaining k-space lines are populated using MR data from the second MR data set; and
   c) transforming the composite data set to produce an MR image having desired ghost artifacts that depict the target component and substantially exclude signal corresponding to the background tissue.

2. The method as recited in claim 1 wherein step c) includes shifting the desired ghost artifacts corresponding to the target component to an image region outside an image region corresponding to the background component.

3. The method as recited in claim 2 further comprising d) truncating the MR image to isolate the desired ghost artifacts depicting the target component and substantially remove signal corresponding to the background component.

4. The method as recited in claim 1 wherein the target component is a vascular structure within the ROI of the subject and the MR image produced in step c) is an angiogram in which the ghost artifacts substantially depict the target vascular structure.

5. The method as recited in claim 4 further comprising:
   a) i) acquiring the first MR data set from the ROI prior to the passing of a contrast agent through the target vascular structure; and
   a) ii) acquiring the second MR data set from the ROI as contrast agent passes through the target vascular structure.

6. The method as recited in claim 4 further comprising:
   a) i) acquiring the first MR data set from the ROI during diastole using a single-shot turbo spin-echo pulse sequence so that signal from the target vascular structure has an increased intensity due to slow blood flow through the target vascular structure; and
   a) ii) acquiring the second MR data set from ROI during systole using the single-shot turbo spin-echo pulse sequence so that signal from the target vascular structure has an decreased intensity due to fast blood flow through the target vascular structure.

7. The method as recited in claim 4 further comprising:
   a) i) acquiring the first MR data set from the ROI using a balanced steady-state free procession pulse sequence having a pre-inversion module so that signal from blood flowing into the target vascular region is substantially suppressed; and
   a) ii) acquiring the second MR data set from the ROI using balanced steady-state free procession pulse sequence without a pre-inversion module so that signal from blood flowing into the target vascular region is not suppressed.

8. The method as recited in claim 4 wherein step b) further includes applying a filtering process to at least a portion of the k-space lines in the composite data set.

9. The method as recited in claim 1 further comprising:
   b) i) populating selected lines of k-space in the composite data set with MR data from the first MR data set;
   b) ii) populating remaining lines of k-space in the composite data set with MR data from the second MR data set.

10. The method as recited in claim 9 wherein the selected and remaining k-space lines in the composite data set are populated using at least one of selected phase-encodes and selected slice-encodes from the first and second MR data sets.

11. The method as recited in claim 9 wherein the selected lines of k-space in the composite data set are even lines of k-space and the remaining lines of k-space in the composite data set are odd lines of k-space.

12. The method as recited in claim 1 wherein step c) includes Fourier transforming the composite data set to produce the MR image having the desired ghost artifact.

13. The method as recited in claim 12 wherein at least two data sets are combined to create the composite data set.

14. A method for producing a medical image of a target component in subject comprising:
   a) acquiring image data from a region-of-interest (ROI) in the subject including a target component and a background component using a medical imaging system;
   b) generating a composite data set configured to produce ghost artifacts from the acquired image data; and
   c) transforming the composite data set to produce a medical image having desired ghost artifacts substantially depicting the target component and substantially excluding signal from the background component.

15. The method as recited in claim 14 wherein step a) includes acquiring a first portion of the image data while the target tissue is in a first state and the background tissue is in a given state and acquiring a second portion of the image data while the target tissue is in a second state and the background tissue is in the given state.

16. The method as recited in claim 15 wherein the target component is a vascular structure and at least one flow-sensitive labeling, radiofrequency pulse labeling, or contrast agent is employed to switch the vascular structure from a first magnetization state to a second magnetization state.

17. The method as recited in claim 15 wherein the medical image is angiogram in which the desired ghost artifacts substantially depict the vascular structure.

18. The method as recited in claim 15 wherein step b) includes selectively combining the first portion of the image data and the second portion of the image data to generate the composite data set.

19. The method as recited in claim 18 wherein selectively combining the first and second portions of the image data includes populating selected k-space lines of the composite data set with information from the first portion of the image data and populating remaining k-space lines of the composite data set with information from the second portion of the image data.

20. The method as recited in claim 19 wherein a conspicuity of the ghost artifacts in the medical image produced in step c) is varied by changing a ratio of the selected k-space lines of the composite data set and the remaining k-space lines of the composite data set.

21. The method as recited in claim 19 wherein the selected and remaining lines of k-space in the composite data set are populated using at least one of the selected phase-encodes and selected slice-encodes from the first and second image data sets.

22. The method as recited in claim 19 wherein the selected lines of the k-space in the composite data set are even lines of k-space and the remaining lines of k-space in the composite data set are odd lines of k-space.

23. The method as recited in claim 14 wherein step c) includes Fourier transforming the composite data set to produce the medical image having desired ghost artifacts.

24. The method as recited in claim 14 wherein step c) includes shifting the desired ghost artifacts corresponding to the target component to an image region outside an image region corresponding to the background component.

25. The method as recited in claim 24 further comprising d) truncating the medical image to isolate the ghost artifacts corresponding to the target component and substantially remove signal corresponding to the background component.

26. The method as recited in claim 25 wherein the medical image is an MR image and the medical imaging system is an MRI system.

27. The method as recited in claim 16 further comprising:
   a) i) acquiring at least two MR data sets from the ROI while a state of the target component changes;
   b) i) generating the composite data set by selectively combining k-space lines from different acquired MR data sets.

28. A method for producing an MR image of a subject comprising:
   a) acquiring a flow-sensitive MR data set from a region-of-interest (ROI) in a subject at periodic intervals without synchronization to the cardiac cycle;
   b) acquiring a flow-insensitive MR data set from the ROI in the subject at periodic intervals with synchronization to the cardiac cycle;
   c) selectively combining the flow-sensitive and flow-insensitive MR data set to produce a composite data; and
   d) transforming the composite data set to produce an MR image having desired ghost artifacts that depict the target component and substantially exclude signal corresponding to the background tissue.

29. The method of claim 28 wherein step d) includes shifting the desired ghost artifacts corresponding to the target component to an image region outside an image region corresponding to the background component.

30. The method as recited in claim 29 further comprising e) truncating the MR image to isolate the desired ghost artifacts depicting the target component and substantially remove signal corresponding to the background component.

* * * * *